United States Patent [19]
Kirchlechner

[11] Patent Number: 5,376,891
[45] Date of Patent: Dec. 27, 1994

[54] PHASE-SENSITIVE RECTIFIER ARRANGEMENT WITH INTEGRATION EFFECT

[75] Inventor: Peter Kirchlechner, Hohenthann, Germany

[73] Assignee: SGS-Thomson Microelectronics GmbH, Grasbrunn, Germany

[21] Appl. No.: 967,635

[22] Filed: Oct. 28, 1992

[30] Foreign Application Priority Data

Oct. 29, 1991 [DE] Germany ............... 4135644

[51] Int. Cl.$^5$ ............................. H01D 3/02
[52] U.S. Cl. ...................... 327/3; 327/156; 327/337
[58] Field of Search ............ 307/490, 352, 353, 514, 307/516; 328/127, 151, 133; 330/9

[56] References Cited

U.S. PATENT DOCUMENTS

| | | | |
|---|---|---|---|
| 4,543,534 | 9/1985 | Temes et al. | 330/09 |
| 4,543,546 | 9/1985 | Hariharan | 328/167 |
| 4,894,620 | 1/1990 | Nagaraj | 328/167 |

FOREIGN PATENT DOCUMENTS

| | | | |
|---|---|---|---|
| 0053014 | 2/1982 | European Pat. Off. | H03K 5/15 |
| 3301792A1 | 8/1983 | Germany . | |
| 3401516A1 | 7/1985 | Germany | H03H 19/00 |
| 1402141 | 8/1975 | United Kingdom | H03D 3/18 |

OTHER PUBLICATIONS

Viswanathan et al., "Increasing The Clock Frequency of Switched Capicitor Filters", Electronic Letters, Apr. 1980, vol. 16, No. 9, pp. 316–317.
Tietze and Schenk, Halbleiter–Schaltungstechnik, 6th ed., Springer–Verlag, pp. 308–310, 1983.
Allen and Sánchez-Sinencio, Switched Capacitor Circuits, Van Nostrand Reinhold Company, New York, pp. 546–547, 1984.
Tietze and Schenk, Halbleiter–Schaltungstechnik, 5th ed., Springer–Verlag, Berlin, pp. 683–687, 1980.
Meade, "Advances in Lock–In Amplifiers," J. Phys. E: Sci. Instrum. 15: 395–402, 1982.
Martin et al., "Switched Capacitor Building Blocks for Adaptive Systems," 1981 IEEE International Symposium on Circuits and Systems Proceedings, Chicago, Ill., vol. 2, pp. 517–518, 1981.

Primary Examiner—Timothy P. Callahan
Assistant Examiner—T. T. Lam
Attorney, Agent, or Firm—Seed and Berry

[57] ABSTRACT

A circuit combining the functions of phase-sensitive rectifier and integrator uses an operational amplifier and capacitors. A control signal switches a capacitor in and out of a feedback loop containing a second feedback capacitor, resulting in a residual charge in the second feedback capacitor if there is a phase-difference between an input signal and the control signal. The invention may also incorporate an automatic offset compensation circuit by using additional switches and a second control signal. The capacitor that is switched in and out of the feedback loop is coupled to a compensation capacitor during periods when the capacitor is not being used for the phase-sensitive rectifier and integrator portions of the circuit. The circuit arrangement allows the use of long time constants in the integrator portion of the circuit.

22 Claims, 6 Drawing Sheets

PHASE-SENSITIVE RECTIFIER ARRANGEMENT WITH INTEGRATION EFFECT

TECHNICAL FIELD

The invention relates to a phase-sensitive rectifier arrangement with integration effect for linking two input signals, comprising an operational amplifier whose inverting input is coupled via a first capacitor with an input signal source delivering a first input signal and whose non-inverting input has a reference potential applied thereto, comprising a second capacitor connected between the inverting input and the output of the operational amplifier, and comprising a controllable switching means controllable by means of a second input signal serving as control signal.

BACKGROUND OF THE INVENTION

A similar rectifier arrangement is known from the book "SWITCHED CAPACITOR CIRCUITS" by P. E. Allen and E. Sanchez-Sinencio, Van Nostrand Reinhold Company, New York, 1984, pages 456 and 457.

The publication by Tietze, U.; Schenk, Ch.: Halbleiter-Schaltungstechnik, Berlin, Springer-Verlag, 5th edition 1980, pages 683 to 687, reveals a phase-sensitive rectifier. Phase-sensitive rectifiers can be understood to be amplifiers with variable amplification factor in which the sign of the amplification factor is not switched cogently with the polarity of the input voltage, but with an external control voltage. The use of a conventional analog multiplier as a phase-sensitive rectifier is also known from the aforementioned document.

A phase-sensitive rectifier is often used with a subsequent integrator, for instance in PLL circuits and demodulation circuits. Integrators with operational amplifiers, in which a capacitor is connected between the output and the inverting input of an operational amplifier and in which the signal to be integrated is supplied to the inverting input of the operational amplifier via a resistor are known from the aforementioned document, page 195. The time behaviour of such an integrator is determined by the time constant R·C of the resistance R of the resistor and the capacitance C of the capacitor.

When an arrangement consisting of a phase-sensitive rectifier and an integrator is to be realized in the form of an integrated circuit (IC), in particular as an IC with close tolerances as regards the time behaviour of the integrator, it is possible to make use of the switched capacitor (SC) technology. With this technology a resistor can be imitated by a switched capacitor.

An integrator in SC arrangement, hereinafter referred to as "switched capacitor integrator", is known from the document EP-A1-0 053 014 and depicted in attached FIG. 1. An operational amplifier OP has a capacitor $C_2$ in the negative feedback branch. The inverting input of operational amplifier OP is connected via a CMOS semiconductor switch $SW_2$ to a first terminal of a capacitor $C_1$ whose second terminal has a reference potential applied thereto. The first terminal of capacitor $C_1$ is connected furthermore to a signal source via a CMOS semiconductor switch $SW_1$. CMOS semiconductor switch $SW_2$ is driven by a first clock signal $\phi_2$. CMOS semiconductor switch $SW_1$ is driven by a second clock signal $\phi_1$ that is of opposite phase and non-overlapping with respect to $\phi_2$. During operation of this arrangement, while semiconductor switch $SW_2$ is open and semiconductor switch $SW_1$ is closed, a charge determined by the signal voltage of the signal source is applied to capacitor $C_1$. When semiconductor switch $SW_2$ is closed and semiconductor switch SW is open, this charge is transferred to capacitor $C_2$. The time behaviour of the switched capacitor integrator is determined by the ratio $C_2/C_1$ of the capacitance of capacitor $C_2$ and the capacitance of capacitor $C_1$. Due to the fact that, in an integrated circuit, the ratio of two capacitances can be adjusted considerably more easily than an RC value, a switched capacitor integrator is particularly suited for implementation as an integrated circuit.

Figure 2:
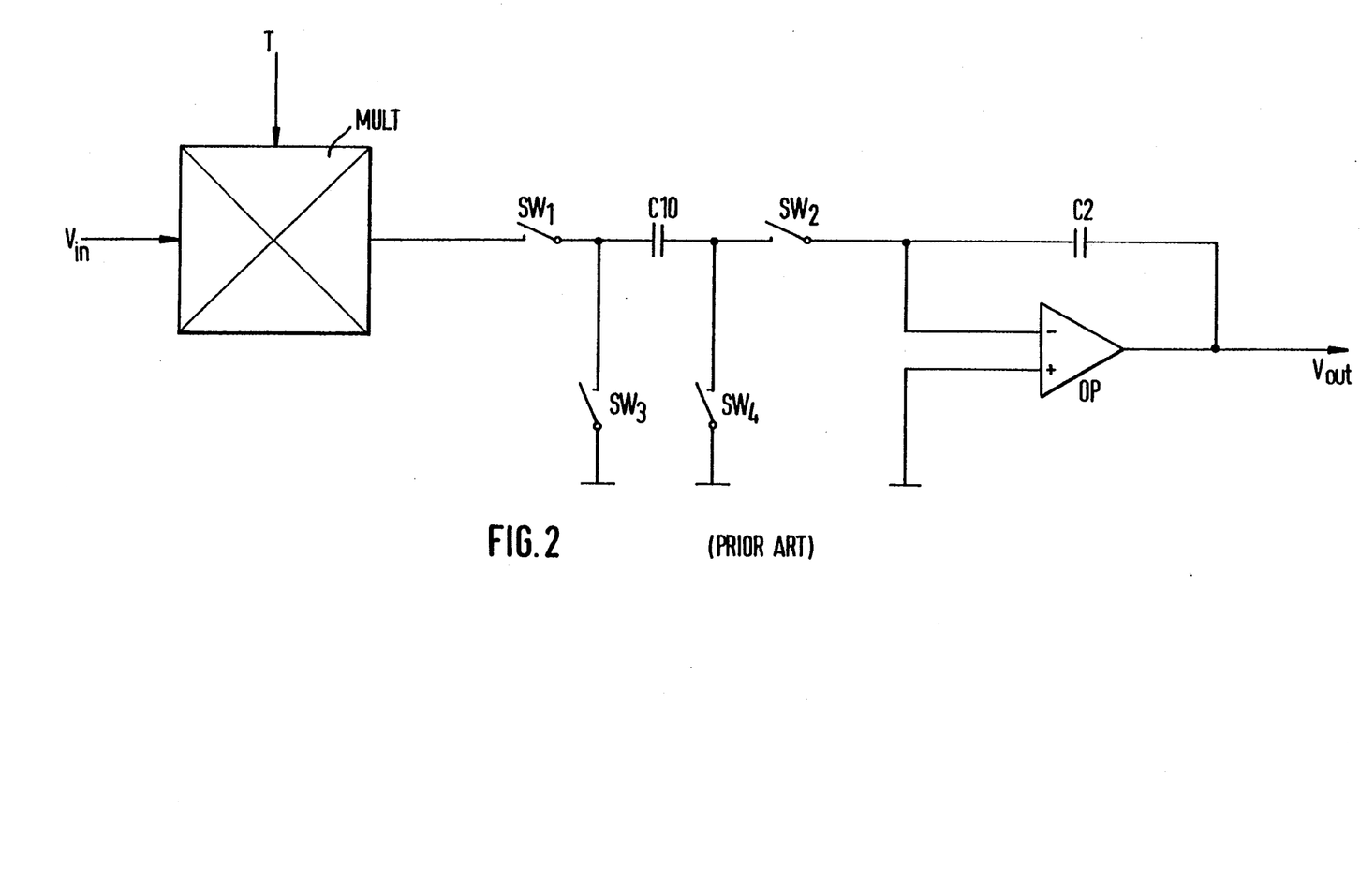
FIG. 2 shows a circuit diagram of a phase-sensitive rectifier arrangement according to the prior art.

FIG. 2 shows a basic circuit diagram of a conventional phase-sensitive rectifier arrangement with integration effect. A similar rectifier arrangement, however with low-pass behaviour, is known from the aforementioned book "SWITCHED CAPACITOR CIRCUITS". The output of an analog multiplier MULT, whose first receives an input signal $V_{in}$ and whose second input receives a control signal T, is connected via a controllable switch means $SW_1$ to a terminal of a capacitor $C_{10}$. The second terminal of capacitor $C_{10}$ is connected via a controllable switch means $SW_2$ to the inverting input of an operational amplifier OP. Between the output and the inverting input of operational amplifier OP there is connected a capacitor $C_2$. The first terminal and the second terminal, respectively, of capacitor $C_{10}$ can be connected to a reference potential selectively via a controllable switch means $SW_3$ and a switch means $SW_4$, respectively. The operational cycle of the circuit comprises a first and a second half period. During the first half period the two switch means $SW_3$ and $SW_4$ are switched into their conducting state, while the switch means $SW_1$ and $SW_2$ are switched into their non-conducting state. Capacitor $C_{10}$ is thus discharged. During the second half period the two switch means $SW_3$ and $SW_4$ are switched into their non-conducting state and switch means $SW_1$ and $SW_2$ are switched into their conducting state. A charge proportional to the output voltage of analog multiplier MULT is thus transferred to capacitor $C_2$ and periodically integrated thereon. The capacitor $C_{10}$ switched with the aid of switch means $SW_1$ to $SW_4$ then simulates an ohmic resistance.

The phase-sensitive rectifier arrangement according to FIG. 2 has the disadvantage that its realization requires many component parts. In case of very high time constants for the integrator, there is furthermore the problem that such high values are required for the capacitor ratio $C_2/C_{10}$ that a circuit according to FIG. 2 can no longer be expediently realized as integrated circuit.

SUMMARY OF THE INVENTION

It is thus an object of the invention to make available a phase-sensitive rectifier arrangement of the type indicated at the beginning, which can be composed with a minimum of component parts and furthermore is suited for being implemented as integrated circuit also in case of very high time constants for the integrator.

This object is met in that the phase-sensitive rectifier arrangement indicated at the beginning has a third capacitor which at one end is connectable to the output of the operational amplifier and at the other end, via the switching means, is adapted to be connected to the inverting input or to have the reference potential coupled thereto, depending on the control signal.

The phase-sensitive rectifier arrangement according to the invention can be utilized for various applications.

Examples are PLL circuits, frequency mixer circuits and demodulators.

The phase-sensitive rectifier arrangement according to the invention makes use of a negative feedback operational amplifier, with the negative feedback thereof being determined either only by the second capacitor or by a parallel connection of second and third capacitors. Depending on whether the control signal just connects the third capacitor to the reference potential or to the inverting input of the operational amplifier, only the second capacitor or a parallel connection of second capacitor and third capacitor is active for the negative feedback between output and inverting input of the operational amplifier. Thus, switchable negative feedback and thus a switchable amplification of the negative feedback operational amplifier is provided. When both capacitors are connected in parallel, the negative feedback effect for the operational amplifier is stronger and, at a specific input signal, the output signal is lower than when the negative feedback occurs only via the second capacitor.

At the output of the phase-sensitive rectifier arrangement according to the invention an output signal is issued that is dependent on the relative phase position of input signal and control signal. When both signals are in phase, or have a phase difference of 180°, an output signal having a constant mean value is created. In case of a phase difference between both signals, the output voltage has a variable mean value. The circuit arrangement according to the invention thus has both phase sensitivity and an integration effect. It thus unites in it the properties of a phase-sensitive rectifier as well as the properties of an integrator. For fulfilling both of these functions in common, just one operational amplifier, three capacitors and a switching means are required.

When the phase-sensitive rectifier arrangement according to the invention is used for instance in a PLL (Phase Locked Loop), the control signal used for the switching means is the output signal of a voltage controlled oscillator the frequency of which is to be brought to the frequency of an input signal supplied to the phase-sensitive rectifier arrangement according to the invention as input signal. As long as there is a phase difference different from 180° between the input signal and the control signal, i.e., the output signal of the voltage controlled oscillator, the output signal of the phase-sensitive rectifier arrangement according to the invention, which is fed to the voltage controlled oscillator as control signal, contains a varying mean value. The frequency of the voltage controlled oscillator is changed until this mean value has become constant. Since this is the case when there is a phase difference 0 between the input signal and the control signal of the phase-sensitive rectifier arrangement according to the invention, this means that the PLL then is synchronized to the frequency of the input signal.

The preceding explanation is based on that the phase-sensitive rectifier arrangement according to the invention is to perform control so as to achieve conformity of the phases of input signal and control signal. However, there are also circuit applications in which it is desired to perform control so as to obtain a phase difference of 90° between input signal and control signal. For the latter case, it is merely necessary to insert a 90° phase shifter, for instance in the line via which the control signal is fed to the phase-sensitive rectifier arrangement.

The mode of operation of the phase-sensitive rectifier arrangement according to the invention can also be described on the basis of charge deliberations, when, without a 90° phase shifter being present, it is assumed for instance that a phase difference of 90° is just present between the input signal and the control signal, the following deliberations apply:

A sinusoidal alternating voltage is applied to the first capacitor as input signal. During the descending slope of the input signal, the charge accumulated in the first capacitor is transferred to the second capacitor disposed in the feedback loop of the operational amplifier. During this time, in which the control signal assumes a first level, the one end of the third capacitor has the reference potential applied thereto by the controllable switching means. During the ascending slope of the input signal the charge accumulated in the first capacitor is subtracted from the charge accumulated in the second capacitor. However, due to the fact that the control signal in this period of time assumes a second level, the third capacitor is connected in parallel to the second capacitor via the controllable switching means. A small charge is thus left in the second capacitor. This sequence is repeated for each period of the input signal, so that these small charges accumulate.

There are a number of advantages achieved by the arrangement according to the invention. The arrangement of the invention requires a minimum of component parts that is considerably lower than the components required for the conventional circuits. Furthermore, it is particularly suited for being used as integrated circuit or as part of such circuit. The invention makes available a circuit through which very high time constants can be realized with small capacitances. This property, too, enhances the suitability of the arrangement according to the invention for being used in integrated circuits.

A preferred embodiment of the invention according to claim 2 renders possible an offset compensation of the operational amplifier. To this end the third capacitor, at times in which it is not connected in the feedback loop of the operational amplifier by a corresponding switching position of the first switching means, is used for offset compensation in cooperation with a fourth capacitor.

In doing so, a second and a third switching means are adapted to be controlled by a second control signal in such a manner that, during part of that period of time of the first control signal during which the third capacitor is coupled with the reference potential, the third capacitor is coupled with the inverting input of the operational amplifier and the fourth capacitor has the reference potential coupled thereto, while otherwise the third capacitor is coupled with the first switching means and the fourth capacitor is coupled with the first capacitor.

Offset compensation of an operational amplifier is known per se from DE 34 01 516 A1, however for a basic circuit component for an SC filter, an SC voltage amplifier or a D-A converter.

BRIEF DESCRIPTION OF THE FIGURES

The invention shall now be elucidated in more detail by way of several embodiments depicted in the associated drawings in which:

FIG. 8 shows a time diagram of an output voltage of a signal source which is fed to the input of a phase-sensitive rectifier arrangement according to the invention;

FIG. 9 shows a time diagram of the voltage at the output of a phase-sensitive rectifier arrangement according to the invention when the voltage shown in FIG. 8 is applied to the input thereof;

FIG. 10 shows a PLL with conventional circuit construction; and

FIG. 11 shows a PLL using a phase-sensitive rectifier arrangement according to the invention.

BRIEF DESCRIPTION OF THE DRAWINGS

Figure 1:
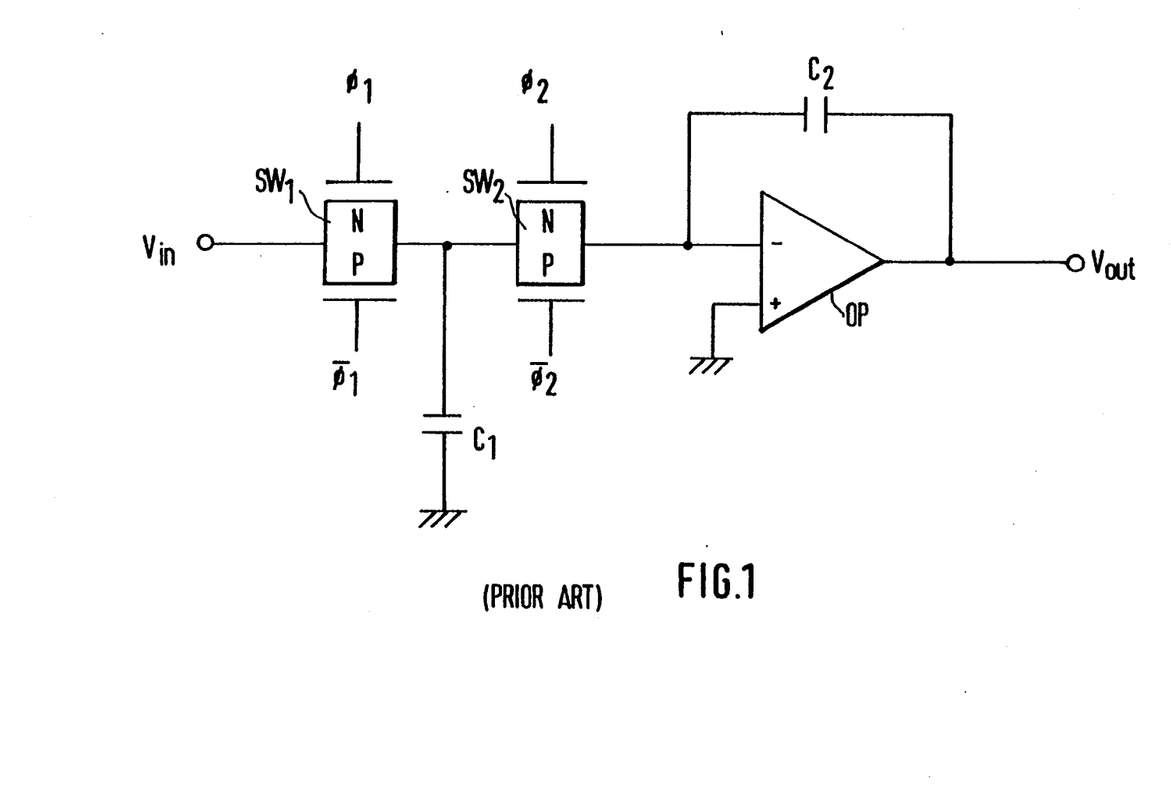
FIG. 1 shows a circuit diagram of a switched capacitor integrator according to the prior art.

FIGS. 1 and 2 have already been elucidated hereinbefore in the discussion of the prior art.

Figure 3:
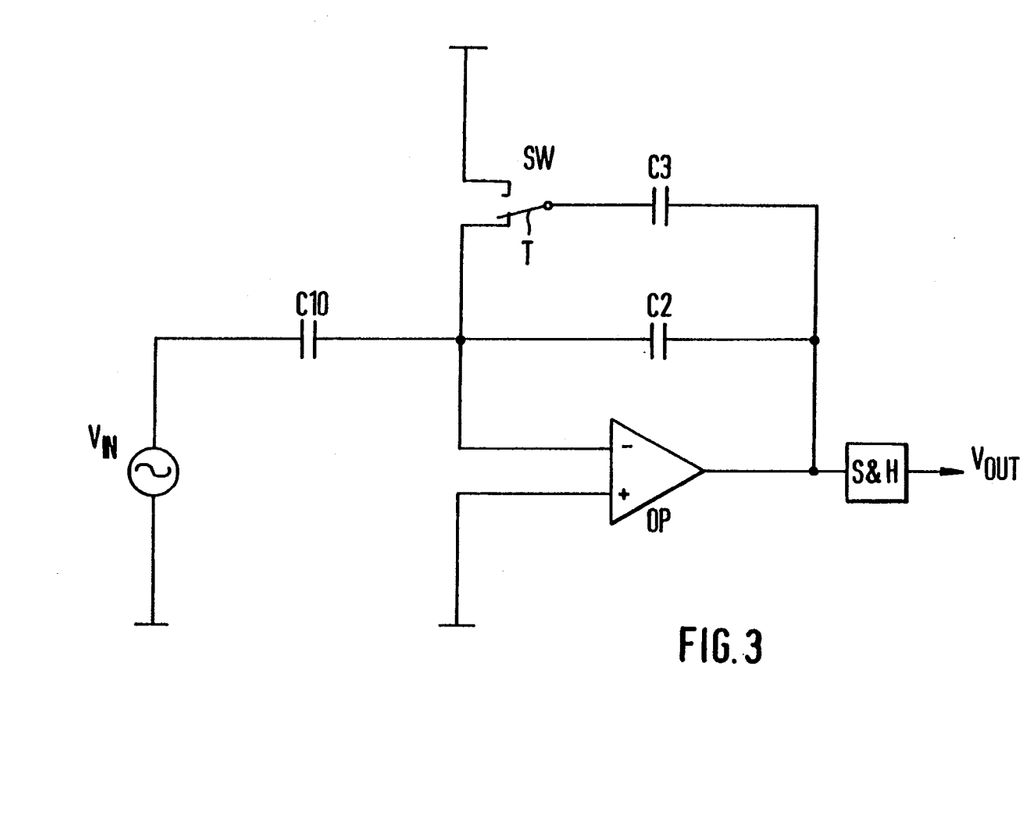
FIG. 3 shows a circuit diagram of a first embodiment of a phase-sensitive rectifier arrangement according to the invention.

FIG. 3 shows a circuit diagram of an embodiment of a phase-sensitive rectifier arrangement with integration effect according to the invention. The output of a signal source is fed as an input signal $V_{IN}$ to a first terminal of a first capacitor $C_{10}$. The second terminal of the first capacitor $C_{10}$ is directly connected to the inverting input of an operational amplifier OP. A second capacitor $C_2$ is connected between the output and the inverting input of said operational amplifier OP. A controllable switching means SW comprises a first terminal, a second terminal and a central terminal. Depending on an electrical control signal T, the second terminal is connected to the central terminal and the first terminal is not connected to the central terminal at a first level of the control signal T, while at a second level of the control signal T the second terminal is not connected to the central terminal and the first terminal is connected to the central terminal. A third capacitor $C_3$ is connected between the output of the operational amplifier OP and the central terminal of the controllable switching means SW, with a first terminal of the third capacitor $C_3$ being connected to the central contact of the controllable switching means SW and a second terminal of the third capacitor $C_3$ being connected to the output of the operational amplifier OP. The second terminal of the controllable switching means SW has a reference potential applied thereto, whereas the first terminal of the controllable switching means SW is connected directly to the inverting input of operational amplifier OP. The non-inverting input of operational amplifier OP has the reference potential applied thereto. The output signal $V_{OUT}$ of the Phase-sensitive rectifier arrangement is issued at the output of operational amplifier OP.

Figure 4:
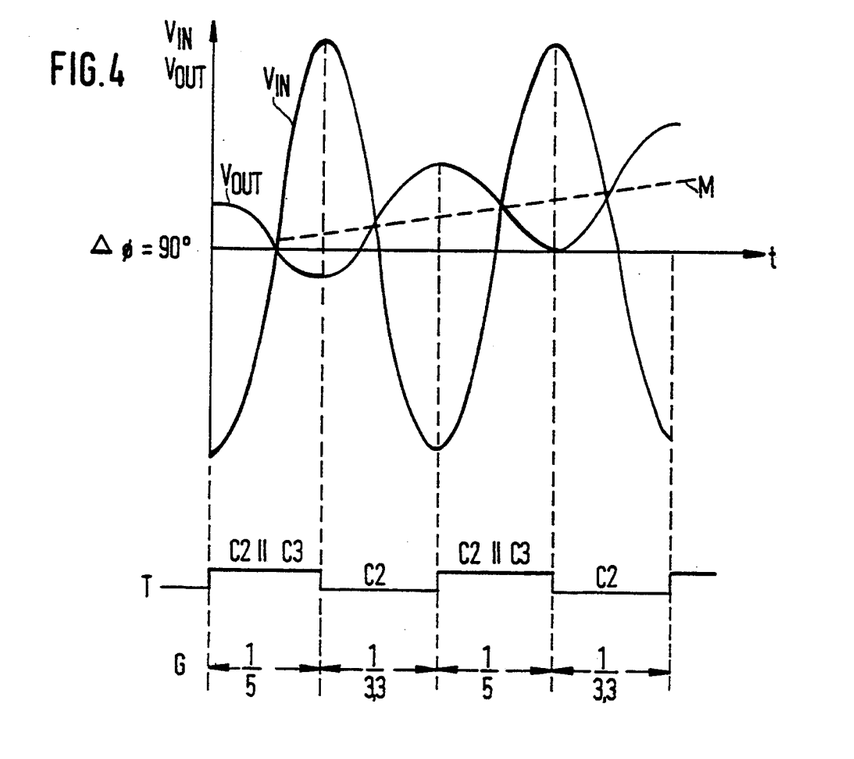
FIG. 4 shows a time diagram with signal patterns in case of a phase difference of 90° between input signal and control signal.
Figure 5:
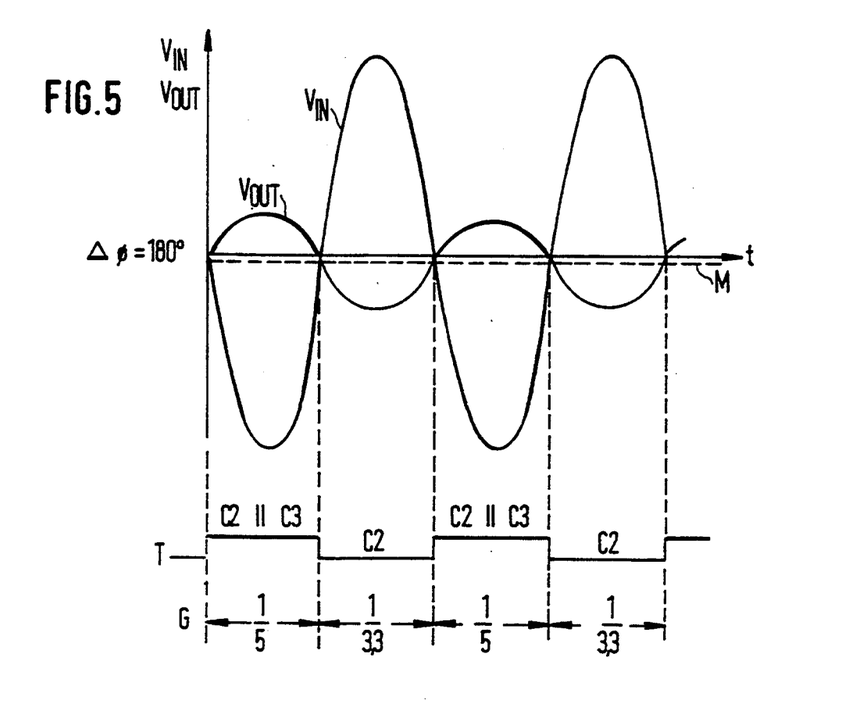
FIG. 5 shows a time diagram with signal patterns in case of a phase difference of 180° between input signal and control signal.

The mode of operation of the phase-sensitive rectifier arrangement according to the invention will now be elucidated in more detail by way of time diagrams in FIGS. 4 and 5. These constitute two examples with respect to the phase relation between the input signal $V_{IN}$ and the control signal T. In the example depicted in FIG. 4, a phase difference $\Delta\phi = 90°$ is assumed. In the example depicted in FIG. 5, a phase difference $\Delta = 180°$ is assumed. A phase difference $\Delta\phi = 0°$ would lead to the same result. There may of course arbitrary other phase differences be present between input signal and control signal.

In the embodiment shown in FIG. 3 of a phase-sensitive rectifier arrangement according to the invention, the first capacitor $C_{10}$ couples the input voltage VIN to the inverting input of the operational amplifier OP. By means of the switching means SW the third capacitor $C_3$, depending on the instantaneous value of the control signal T, is either connected in parallel to the second capacitor $C_2$ or has the reference potential or ground applied thereto. The result of this measure is that the operational amplifier OP has a switchable negative feedback which in alternating manner is constituted either only by the second capacitor $C_2$ or by the parallel connection of capacitors $C_2$ and $C_3$. When both capacitors are connected in parallel, the negative feedback effect is stronger for the operational amplifier OP, and at a specific input signal $V_{IN}$ the output signal becomes smaller than when the negative feedback takes place via $C_2$ only.

Due to the negative feedback of the operational amplifier OP the output voltage $V_{OUT}$ is smaller than the input voltage $V_{IN}$. The negative feedback operational amplifier OP thus has an amplification of less than 1, as shown in FIGS. 4 and 5. It is assumed merely as a matter of example in FIGS. 4 and 5 that the amplification during the parallel connection of $C_2$ and $C_3$ has a value of 1/5 and during those periods of time, during which the negative feedback is determined by $C_2$ only, has a value of 3.3.

When looking first at the time diagram in FIG. 4, both capacitors $C_2$ and $C_3$ are connected in parallel during the ascending slope of the input signal $V_{IN}$, whereas $C_2$ only is effective during the descending slopes of the input signal $V_{IN}$. The descending slope of the output signal $V_{OUT}$ is thus followed by an ascending slope of this output signal $V_{OUT}$, the end of which, due to the greater amplification or lesser attenuation of the input signal during this period of time, is located at a higher value than the beginning of the first descending slope of the output signal $V_{OUT}$ shown in FIG. 4. This ascent of the respective end point of the ascending slope of the output signal $V_{OUT}$ continues across the subsequent periods of the output signal $V_{OUT}$ so that the mean value thereof increases. This is shown by a broken line M in FIG. 4.

At a phase difference of 90° between the input signal $V_{IN}$ and the control signal T, the mean value M of the output signal thus increases, which means an integrating effect.

When looking at the case of FIG. 5 showing a phase difference of $\Delta = 180°$ between input signal $V_{IN}$ and control signal T, one can see that the attenuation between input signal $V_{IN}$ and output signal $V_{OUT}$ is in fact different between the successive half periods, but that a mean value M results which is constant. The integrated signal is thus constant, in contrast to the case of a phase difference of 90° between input signal $V_{IN}$ and control signal T, as shown in FIG. 4.

A comparison of FIGS. 4 and 5 thus reveals that the circuit according to the invention acts both as a phase-sensitive rectifier and as an integrator.

The mode of operation of the phase-sensitive rectifier arrangement can also be seen again on the basis of charging operations. The link between the different views is the known relationship according to which charge is the product of capacitance and voltage.

The following consideration of the charge relationships starts from the example that the input voltage $V_{IN}$ is a sinusoidal alternating voltage having a phase difference of 90° with respect to the control voltage T. This sinusoidal alternating voltage is fed to the first capacitor $C_{10}$ as input signal $V_{IN}$. During the descending slope of the input signal $V_{IN}$ the charge accumulated in the first capacitor $C_{10}$ is transferred to the second capacitor $C_2$ disposed in the feedback loop of the operational amplifier OP. During this period of time, in which the control signal T assumes the first level, the first terminal of the third capacitor $C_3$ has the reference potential applied thereto by the controllable switching means SW. During the ascending slope of the input signal $V_{IN}$, the charge accumulated in the first capacitor $C_{10}$ is subtracted from the charge accumulated on the second capacitor $C_2$. However, due to the fact that the control signal T assumes the second level in this period of time, the third capacitor $C_3$ is connected in parallel to the second capacitor $C_2$ via the controllable switching means SW. A small charge is thus left in the second capacitor $C_2$. This sequence is repeated for each period so that these small charges accumulate.

The time constant $\tau$ Of the integrator is determined as:

$$\tau \approx \frac{C_2^2}{C_{10} \cdot C_3} \cdot \underline{T} \text{ (for } C_2 >> C_{10}, C_3\text{)} \quad (1)$$

with the clock period of the control signal T being designated T. Due to the fact that the capacitance of the second capacitor $C_2$ is applied square in the calculation of the time constant $\tau$ according to equation (1), it is possible to realize high time constants at moderately high ratios between capacitance of the second capacitor $C_2$ and the product of the capacitances of the first capacitor $C_{10}$ and the third capacitor $C_3$.

Figure 6:
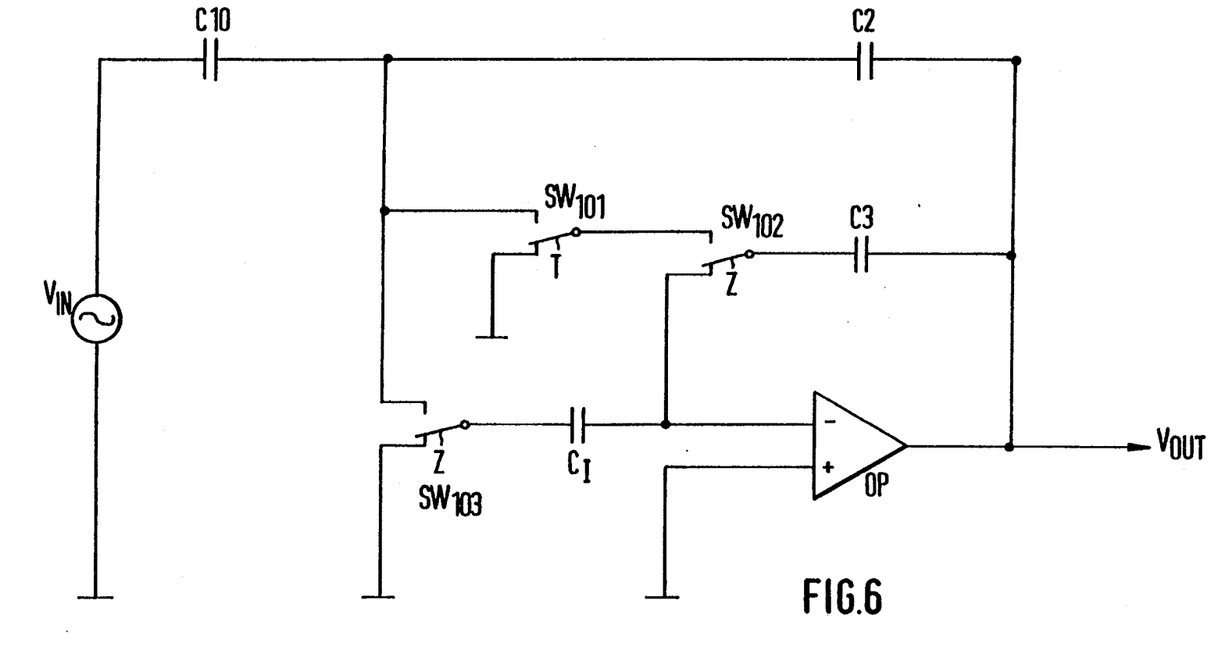
FIG. 6 shows a circuit diagram of a second embodiment of a phase-sensitive rectifier arrangement according to the invention.

FIG. 6 shows a circuit diagram of a second embodiment of a phase-sensitive rectifier arrangement with integration effect according to the invention, which is provided with offset compensation. This design comprises a first, second and third controllable switching means $SW_{101}$, $SW_{102}$ and $SW_{103}$, respectively. Each of the controllable switching means $SW_{101}$, $SW_{102}$, $SW_{103}$ has a first terminal, a second terminal and a central terminal. Depending on the application of a particular first or second electrical control terminal T, Z, the first terminal is connected to the central terminal and the second terminal is not connected to the central terminal when the particular control signal T, Z has a first level, whereas at a second signal level of the respective control signal T, Z, the first terminal is not connected to the central terminal and the second terminal is connected to the central terminal.

The output of a signal source is fed as an input signal $V_{IN}$ to a first terminal of a first capacitor $C_{10}$. The second terminal of the first capacitor $C_{10}$ is connected directly to a first terminal of a second capacitor $C_2$, to the first terminal of the first switching means $SW_{101}$ controllable in response to the first control signal T, and to the first terminal of the third switching means $SW_{103}$ controllable in response to the second control signal Z. The second terminal of the first controllable switching means $SW_{101}$ and the second terminal of the third controllable switching means $SW_{103}$ have a reference potential applied thereto. The central terminal of the first controllable switching means $SW_{101}$ is connected directly to the first terminal of the second controllable switching means $SW_{102}$. Connected between the central terminal of the second controllable switching means $SW_{102}$ and the output of an operational amplifier OP is a third capacitor $C_3$, with a first terminal of the third capacitor $C_3$ being connected to the central terminal of the second controllable switching means $SW_{102}$, and a second terminal of the third capacitor $C_3$ being connected to the output of operational amplifier OP. The second terminal of the second controllable switching means $SW_{102}$ is connected directly to the inverting input of the operational amplifier OP. The second terminal of the second capacitor $C_2$ is connected directly to the output of the operational amplifier OP. A fourth capacitor $C_2$ is connected between the central terminal of the third controllable switching means $SW_{103}$ and the inverting input of the operational amplifier OP. The non-inverting input of the operational amplifier OP has the reference potential applied thereto. The output signal $V_{OUT}$ of the phase-sensitive rectifier arrangement is taken off at the output of the operational amplifier OP.

The afore-described second embodiment of a phase-sensitive rectifier arrangement according to the invention operates in several operating conditions which will be explained in the following with reference to FIG. 7.

Figure 7:
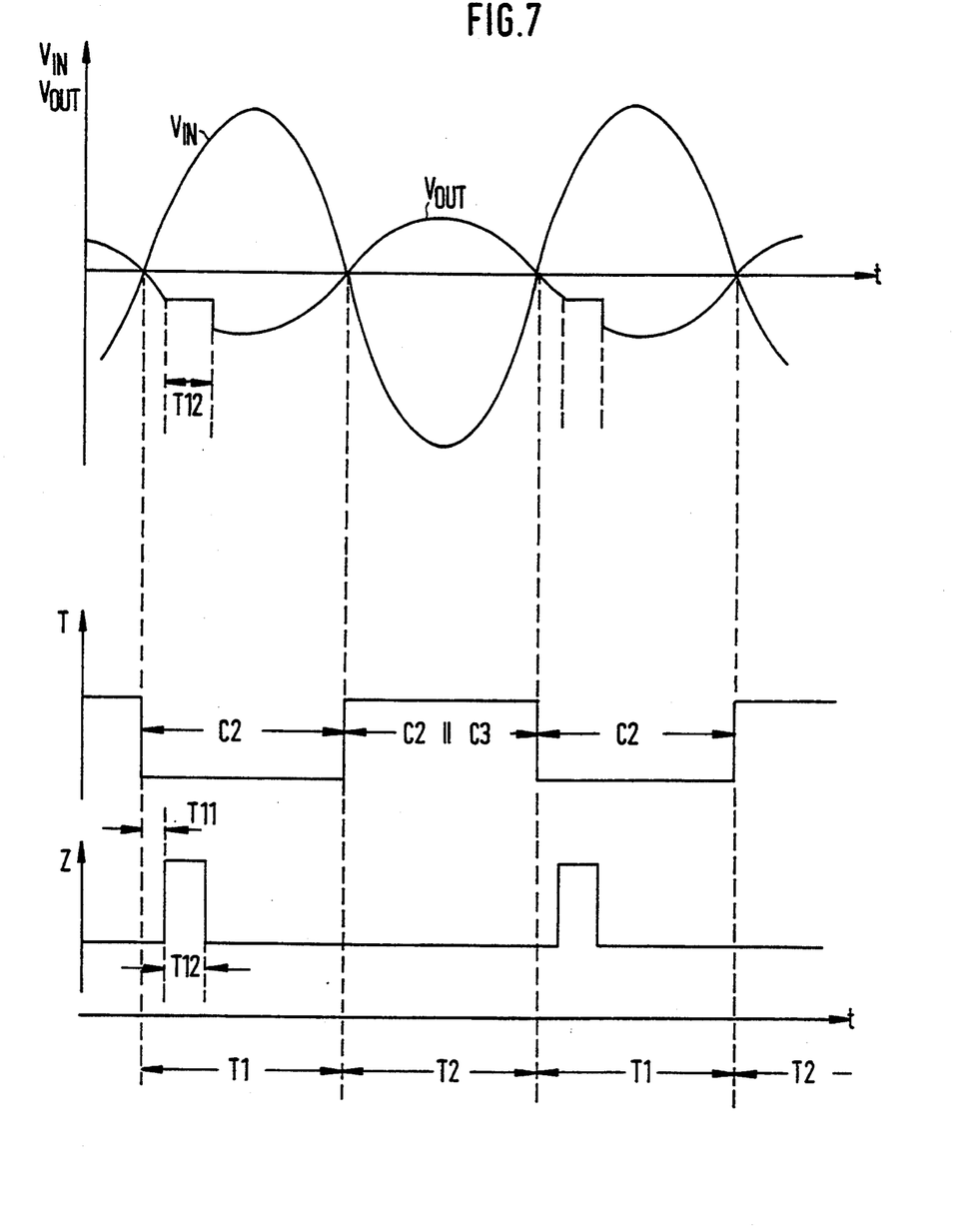
FIG. 7 shows a time diagram with signal patterns, inclusive of two control signals T and Z.

FIG. 7 shows a time diagram of the control signals T and Z. The first control signal T may assume either a first (low) signal level or a second (high) signal level. In like manner, the second control signal Z may assume either a first (low) signal level or a second (high) signal level. At the beginning of a first period of time T1, in which the first control signal T assumes the first level, there is a shorter, second period of time T11 in which the second control signal Z assumes the first level. During this time the first terminal of the third capacitor $C_3$ has the reference potential applied thereto via the first controllable switching means $SW_{101}$ and the second controllable switching means $SW_{102}$, so that the third capacitor $C_3$ in this condition of the switching means $SW_{101}$, $SW_{102}$ and $SW_{103}$ is not active for the phase-sensitive rectifier arrangement. After the end of the second period of time T11, the condition of the second control signal Z changes, which now assumes the second level during a third period of time T12. During the period T12, the circuit according to FIG. 6 assumes the conditions of the switching means shown there. During this third period of time T12 which, just as the second period of time T11, is located completely within the first period of time T1, the fourth capacitor $C_I$ takes over, via the second and third controllable switching means $SW_{102}$, $SW_{103}$, a charge amount corresponding to the offset voltage of the operational amplifier OP for automatic zero balancing of the circuit.

A sinusoidal alternating voltage $V_{IN}$ is applied as input signal to the first terminal of the first capacitor $C_{10}$. During the descending slope of the input signal $V_{IN}$, the charge accumulated in the first capacitor $C_{10}$ is transferred to the second capacitor $C_2$ disposed in the feedback loop of the operational amplifier OP. During this first period of time T1, in which the first control signal T assumes the first level and the second control signal Z assumes the first or second level, either the afore-described automatic zero balancing takes place or the first terminal of the third capacitor $C_3$ has the reference potential applied thereto by the first and second controllable switching means $SW_{101}$ and $SW_{102}$. During the ascending slope of the input signal $V_{IN}$, the charge accumulated in the first capacitor $C_{10}$ is subtracted from the charge accumulated on the second capacitor $C_2$. However, as the first control signal T during this time, in a fourth period of time T2 directly following the first period of time T1, assumes the second level and the second control signal Z assumes the first level, the third capacitor $C_2$ is connected in parallel to the second capacitor $C_2$ via the controllable switching means $SW_{101}$ and $SW_{102}$. Thus, a small charge is left in the second capacitor $C_2$. This sequence is repeated for each period of the input signal VIN so that these small charges accumulate.

FIG. 7 illustrates the input voltage $V_{IN}$ and the output voltage $V_{OUT}$ for making clear the relationship between these two voltages and the control signals T and Z. t is assumed therein, as a mere example, that there is phase conformity between the input voltage $V_{IN}$ and the control signal T. The time diagram of FIG. 7 thus corresponds to FIG. 5 as regards input voltage $V_{IN}$, output voltage $V_{OUT}$ and control signal T.

A comparison of FIGS. 3 and 6 shows that the embodiment according to FIG. 6 operates in the same manner as the embodiment shown in FIG. 3 when the switching means $SW_{102}$ connects capacitor $C_3$ to the switching means $SW_{101}$. In the example shown in FIG. 7, this holds for the periods outside of the times T12 of the control signal Z. During said times, the capacitor $C_I$ is connected by the switching means $SW_{103}$ to the connecting node between capacitors $C_{10}$ and $C_2$.

During the periods of time T12 of the control signal Z, the capacitor $C_3$ is connected via the switching means $SW_{102}$ to the inverting input of the operational amplifier, and the reference potential or ground is applied to capacitor $C_I$ via the switching means $SW_{103}$. The third capacitor $C_3$ thus has a double function. During the half periods T2 of the control signal T, $C_3$ cooperates in the negative feedback of the operational amplifier OP. During the periods of time T12 of the control signal Z within the other half periods T1 of the control signal T, $C_3$ cooperates in the offset compensation. The third capacitor $C_3$ thus is employed only for offset compensation when it does not cooperate in the negative feedback of the operational amplifier OP.

The controllable switching means are composed in a preferred embodiment using bipolar or MOS transistors FIG. 8 shows a time diagram of a sinusoidal input voltage $V_{IN}$ fed to the input of a phase-sensitive rectifier arrangement according to the invention. This signal pattern corresponds to the signal patterns of $V_{IN}$ in FIGS. 4 and 5, however with a different scale of the time axis t.

FIG. 9 shows a signal pattern of an output voltage $V_{OUT}$ of the type shown in FIG. 4, which is again depicted with a different scale of the time axis t as compared to FIG. 4. The continuous broken line in FIG. 9 corresponds to the linearly rising broken mean value line in FIG. 4 and thus is also marked M. The mean value line M in FIG. 9 has a sinusoidal wave pattern superimposed thereon. This corresponds to the sinusoidal pattern of the output voltage $V_{OUT}$ in FIG. 4, having an ascent corresponding to the mean value line M.

In applications in which the sinusoidal pattern of the output voltage $V_{OUT}$, which is superimposed on the mean value M, could have a disturbing effect, smoothening can be achieved by a circuit arrangement downstream of the output of the operational amplifier OP, such as for instance a sample and hold circuit S & H, as shown in FIG. 3. The circuit may further include a sample and hold circuit with a sample input coupled to said amplifier output, a sample output, and a hold signal having a sample period and a hold period, said sample output being maintained at a substantially constant voltage when said bold signal is in said bold period.

An example for the application of the phasesensitive rectifier arrangement according to the invention is the use thereof in a PLL.

FIG. 10 shows a PLL with conventional circuit construction. A voltage controlled oscillator VCO has a series connection of a conventional phase-sensitive rectifier 11 and a conventional integrator 13, which is connected in parallel thereto. The phase-sensitive rectifier 11 is fed with an input signal $V_{IN}$ on which the frequency of VCO is to be locked in. The output signal of VCO is fed to the phase-sensitive rectifier in the form of the control signal T as second input signal. The output signal $V_{OUT}$ of the integrator 13 is supplied to VCO as input signal.

FIG. 11 shows a PLL composed with a phasesensitive rectifier arrangement 15 according to the invention. The latter is constructed for instance according to FIG. 3. Its output voltage $YOU_T$ controls VCO. The output signal T of the latter is compared by the phasesensitive rectifier arrangement 15 with the input signal $V_{IN}$ in terms of phase.

With a PLL designed according to the invention, the voltage controlled oscillator VCO thus cooperates with only one single circuit having simultaneously both the function of a phase-sensitive rectifier and the function of an integrator. A PLL of such construction thus requires only a comparatively small number of circuit components. This is particularly advantageous and important under the aspect of monolithic integration.

What is claimed is:

1. A phase-sensitive rectifier arrangement with integration effect for comparing the phase of two input signals, comprising:

a first signal input for receiving a first one of the two input signals;

a second signal input for receiving a second one of the two input signals, said second input signal having a frequency approximately equal to a frequency of said first input signal;

an output signal that is dependent on the relative phase position of the two input signals;

a first switching means whose switching condition is dependent on the second input signal;

a reference potential source;

an operational amplifier having an inverting input, a non-inverting input connected to the reference potential source, and an output coupled with said output;

a first capacitor disposed between the first signal input and the inverting input of the operational amplifier;

a second capacitor disposed between the inverting input and said amplifier output; and a third capacitor having one end coupled with said amplifier output and the other end coupled with the first switching means;

said first switching means, depending on the second signal, coupling the end of the third capacitor not connected to said amplifier output either with the end of the second capacitor not connected to said amplifier output or with the reference potential source, said first switching means switching at a rate equal to said frequency of said second input signal to produce the signal that is dependent on the relative phase position of the two input signals.

2. A phase-sensitive rectifier arrangement according to claim 1, comprising:
a fourth capacitor;
a second switching means;
a third switching means; and
a signal source for an offset compensation control signal;
said second switching means, depending on the offset compensation control signal, coupling the end of the third capacitor not connected to said amplifier output either with said first switching means or with the inverting input of the operational amplifier;
said fourth capacitor having one end coupled with the inverting input of the operational amplifier and the other end with said third switching means;
said third switching means, depending on the offset compensation control signal, coupling the other end of said fourth capacitor either with the first capacitor or with the reference potential source; and
said offset compensation control signal controlling said second and said third switching means such that, during part of that period of time of the control signal during which the third capacitor is coupled with the reference voltage source, the third capacity is coupled with the inverting input of the operational amplifier and the fourth capacitor is coupled with the reference potential source, whereas otherwise said third capacitor is coupled with said first switching means and said fourth capacitor is coupled with said first capacitor.

3. A phase-sensitive rectifier arrangement according to claim 1, wherein said first switching means is composed with at least one transistor.

4. A phase-sensitive rectifier arrangement according to claim 2, wherein said first, second and third switching means are each composed with at least one transistor.

5. A phase-sensitive rectifier arrangement according to claim 1, comprising a sample and hold circuit coupled with said amplifier output.

6. A PLL including:
a voltage controlled oscillator having an oscillator input and an oscillator output having a first frequency;
a phase-sensitive rectifier arrangement with integration effect for phase comparison of an output signal of the voltage controlled oscillator having a first frequency to an input signal of the PLL circuit, said input signal having a second frequency approximately equal to said first frequency, said phase-sensitive rectifier arrangement comprising:
a first signal input for receiving said input signal;
a second signal input for receiving said output signal of said voltage controlled oscillator;
an output;
a first switching means whose switching condition is dependent on said output signal of said voltage controlled oscillator;
a reference potential source;
an operational amplifier having an inverting input, a non-inverting input connected to the reference potential source, and an output coupled with the output of the phase-sensitive rectifier arrangement;
a first capacitor disposed between the first signal input and the inverting input of the operational amplifier;
a second capacitor disposed between the inverting input and the output of the operational amplifier;
a third capacitor having one end coupled with the output of the operational amplifier and the other end coupled with the first switching means;
said first switching means, depending on the output signal of said voltage controlled oscillator, coupling the end of the third capacitor not connected to the output of the operational amplifier either with the end of the second capacitor not connected to the output of the operational amplifier or with the reference potential source, said first switching means switching at a rate equal to said first frequency; and
the output of said phase-sensitive rectifier arrangement being coupled with said oscillator input and said oscillator output being coupled with the second signal input of the phase-sensitive rectifier arrangement.

7. A phase-sensitive integrator circuit, comprising:
an operational amplifier having an inverting input and a non-inverting input and an amplifier output producing an output signal, said non-inverting input coupled to a signal reference voltage;
a first feedback capacitor coupled between said amplifier output and said inverting input to define a feedback network;
an input capacitor coupled between an input signal having a first frequency and said inverting input;
switching means for coupling a switch common terminal alternatively to first or second switch terminals, said switching means including a switch control to selectively couple said common terminal alternatively to said first or second switch terminals;
a second feedback capacitor coupled between said amplifier output and said switch common terminal to cause said second feedback capacitor to be selectively switched in and out of said feedback network; and
a control signal having a second frequency approximately equal to said first frequency, said control signal being coupled to said switch control and causing said switch means to couple said switch common terminal alternatively to said first or second switch terminals based on an instantaneous value of said control signal and at a rate equal to said second frequency to generate said output signal having a voltage level proportional to the phase difference between said input signal and said control signal.

8. The circuit of claim 7, further including a voltage controlled oscillator having an oscillator output and a control voltage input, said oscillator output being coupled to said switch control and providing said control signal to said switch control, said amplifier output being coupled to said control voltage input forming a phase-locked loop, whereby said oscillator output signal is phase-locked with said input signal.

9. The circuit of claim 7 wherein said switching means includes at least one transistor.

10. The circuit of claim 7, further including a sample and hold circuit with a sample input coupled to said amplifier output, a sample output, and a hold signal having a sample period and a hold period, said sample output being maintained at a substantially constant voltage when said hold signal is in said hold period.

11. A phase-sensitive integrator circuit, comprising:
an operational amplifier having an inverting input and a non-inverting input and an amplifier output producing an output signal, said non-inverting input coupled to a signal reference voltage;
a first feedback capacitor coupled between said output and said inverting input to define a feedback network;
an input capacitor coupled between an input signal having a first frequency and said inverting input, said input capacitor transferring an electrical charge to said feedback capacitor during a period of time in which said input signal has an ascending slope and discharging said feedback capacitor during a period of time in which said input signal has a descending slope;
switching means for coupling a common terminal alternatively to first or second switch terminals, said switching means having a switch control to selectively couple said common terminal alternatively to said first or second switch terminals, said first switch terminal being coupled to said inverting input and said second switch terminal being coupled to said signal reference voltage;
a control signal having a second frequency approximately equal to said first frequency, said control signal being coupled to said switch control; and
a second feedback capacitor coupled between said output and said common terminal and selectively switched in and out of said feedback network in parallel with said first feedback capacitor by said control signal at a rate equal to said second frequency, said second feedback capacitor being in parallel with said first feedback capacitor control signal is at a first voltage level and said second feedback capacitor being coupled between said amplifier output and said signal reference voltage when said control signal is at a second voltage level, said input capacitor always charging and discharging said first feedback capacitor and charging and discharging said second feedback capacitor when said control signal is at said first voltage level to cause a charge to accumulate in said first feedback capacitor in proportion to the difference in phase between said input signal and said control signal.

12. The circuit of claim 11, further including a voltage controlled oscillator having an oscillator output and a control voltage input, said oscillator output providing said control signal to said switch control, said amplifier output being coupled to said control voltage input forming a phase-locked loop, whereby said oscillator output signal is phase-locked with said input signal.

13. The circuit of claim 11, further including a sample and hold circuit with a sample input coupled to said output, a sample output, and a hold signal having a sample period and a hold period, said sample output being maintained at a substantially constant voltage when said hold signal is in said hold period.

14. The circuit of claim 11 wherein said switching means includes at least one transistor.

15. A phase-sensitive integrator circuit offset compensation, comprising:

an operational amplifier having an inverting input and a non-inverting input and an amplifier output producing an output signal, said non-inverting input coupled to a signal reference voltage;
first switching means for coupling a common terminal of said first switching means alternatively to a first or second switch terminals of said first switching means, said first switching means having a first switch control to selectively couple said common terminal of said first switching means alternatively to said first or second switch terminals of said first switching means, said second switch terminal of said first switching means coupled to said reference signal;
second switching means for coupling a common terminal of said second switching means alternatively to a first or second switch terminals of said second switching means, said second switching means having a second switch control to selectively couple said common terminal of said second switching means alternatively to said first or second switch terminals of said second switching means, said first switch terminal of said second switching means coupled to said common terminal of said first switching means, said second switch terminal of said second switching means coupled to said inverting input;
third switching means for coupling a common terminal of said third switching means alternatively to a first or second switch terminals of said third switching means, said third switching means having a third switch control to selectively couple said common terminal of said third switching means alternatively to said first to second switch terminals of said third switching means, said first switch terminal of said third switching means coupled to said first switch terminal of said first switching means, said second switch terminal of said second switching means coupled to said reference signal;
an input capacitor coupled between an input signal and said first switch terminal of said first switching means and said first switch terminal of said second switching means;
a first feedback capacitor coupled between said amplifier output and said first switch terminal of said first switching means and said first switch terminal of said second switching means;
a second feedback capacitor coupled between said amplifier output and said common terminal of said first switching means;
a compensation capacitor coupled between said inverting input and said common terminal of said third switching means;
a first control signal coupled to said first switch control to selectively couple said input capacitor to said common terminal of said first switching means when said first control signal is at a first signal voltage level, and to disconnect said input capacitor from said common terminal of said first switching means when said first control voltage is at a second signal voltage level; and
a second control signal coupled to said second an third switch controls to selectively couple said second feedback capacitor in series with said compensation capacitor between said output and said reference signal when said second control signal is at a third signal voltage level and to couple said second feedback capacitor to said common terminal of said first switching means and said compensation capacitor to said input capacitor when said second control signal is at a fourth voltage level, said second control signal having a timing relationship with said first control signal so that said second control signal is only at said third voltage level when said first control signal is at said second voltage level, said output signal having a mean voltage proportional to the phase difference between said first control signal sand said input signal, said output signal also having an offset compensation signal proportional to the offset voltage produced by said differential amplifier, whereby said second feedback capacitor is selectively switched in and out of a feedback network on said differential amplifier and is used in a compensation network when said second feedback capacitor is selectively switched out of said feedback network.

16. The circuit of claim 15, further including a voltage controlled oscillator having an oscillator output and a control voltage input, said oscillator output providing said control signal to said first switch control, said amplifier output being coupled to said control voltage input forming a phase-locked loop, whereby said oscillator output signal is phase-locked with said input signal.

17. The circuit of claim 15 wherein said first, second, and third switching means each includes at least one transistor.

18. The circuit of claim 15, further including a sample and hold circuit with a sample input coupled to said amplifier output, a sample output, and a hold signal having a sample period and a hold period, said sample output being maintained at a substantially constant voltage when said hold signal is in said hold period.

19. A PLL circuit according to claim 6, comprising:
a fourth capacitor;
a second switching means;
a third switching means; and
a signal source for an offset compensation control signal;
said second switching means, depending on the offset compensation control signal, coupling the end of the third capacitor not connected to the output of the operational amplifier either with said first switching means or with the inverting input of the operational ampliifer;
said fourth capacitor having one end coupled with the inverting input of the operational amplifier and the other end with said third switching means;
said third switching means, depending on the offset compensation control signal, coupling the other end of said fourth capacitor either with the first capacitor or with the reference potential source; and
said offset compensation control signal controlling said second and said third switching means such that, during part of that period of time of the output signal of the voltage controlled signal during which the third capacitor is coupled with the reference voltage source, the third capacitor is coupled with the inverting input of the operational amplifier and the fourth capacitor is coupled with the reference potential source, whereas otherwise said third capacitor is coupled with said first switching means and said fourth capacitor is coupled with said first capacitor.

20. A PLL circuit according to claim 6, comprising a sample and hold circuit coupled with the output of the operational amplifier.

21. A phase-sensitive rectifier arrangement with integration effect for linking first and second input signals into an output signal that is dependent on the relative phase position of the two input signals, comprising:
a first signal input for receiving the first input signal;
a second signal input for receiving the second input signal acting as a first control signal;
an output producing the output signal;
a first switching means whose switching condition is dependent on the second input signal;
a reference potential source;
an operational amplifier having an inverting input, a non-inverting input connected to the reference potential source, and an amplifier output coupled with said output;
a first capacitor disposed between the signal input and the inverting input of the operational amplifier;
a second capacitor disposed between the inverting input and said amplifier output;
a third capacitor having one end coupled with said amplifier output and the other end coupled with the first switching means;
said first switching means, depending on said first control signal, coupling the end of the third capacitor not connected to said amplifier output either with the end of the second capacitor not connected to said amplifier output or with the reference potential source;
a fourth capacitor;
a second switching means;
a third switching means; and
a signal source for an offset compensation control signal;
said second switching means, depending on the offset compensation control signal, coupling the end of the third capacitor not connected to said amplifier output either with said first switching means or with the inverting input of the operational amplifier;
said fourth capacitor having one end coupled with the inverting input of the operational amplifier and the other end with said switching means;
said third switching means, depending on the offset compensation control signal, coupling the other end of said fourth capacitor either with the first capacitor or with the reference potential source; and
said offset compensation control signal controlling said second and said third switching means such tat, during part of that period of time of said first control signal during which the third capacitor is coupled with the reference voltage source, the third capacitor is coupled with the inverting input of the operational amplifier and the fourth capacitor is coupled with the reference potential source, whereas otherwise said third capacitor is coupled with said first switching means and said fourth capacitor is coupled with said first capacitor.

22. A phase-sensitive rectifier arrangement according to claim 21 wherein said first, second and third switching means are each composed with at least one transistor.

* * * * *

UNITED STATES PATENT AND TRADEMARK OFFICE
CERTIFICATE OF CORRECTION

PATENT NO. : 5,376,891

DATED : December 27, 1994

INVENTOR(S) : Peter Kirchlechner

It is certified that error appears in the above-identified patent and that said Letters Patent is hereby corrected as shown below:

In column 11, claim 2, line 31, please delete "capacity" and substitute therefor --capacitor--.

In column 13, claim 11, line 38, after "capacitor" and before "control", please insert --when said--.

In column 14, claim 15, line 34, please delete "to" (2nd occur.) and substitute therefor --or--.

In column 16, claim 21, line 55, please delete "tat" and substitute therefor --that--.

Signed and Sealed this

Eleventh Day of July, 1995

Attest:

BRUCE LEHMAN

Attesting Officer

Commissioner of Patents and Trademarks